(12) United States Patent
Matsumura

(10) Patent No.: US 7,150,388 B2
(45) Date of Patent: Dec. 19, 2006

(54) METHOD OF BONDING AND BONDING APPARATUS FOR A SEMICONDUCTOR CHIP

(75) Inventor: Takayoshi Matsumura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 38 days.

(21) Appl. No.: 11/022,867

(22) Filed: Dec. 28, 2004

(65) Prior Publication Data

US 2006/0043149 A1    Mar. 2, 2006

(30) Foreign Application Priority Data

Aug. 27, 2004   (JP) ............................. 2004-247663
Oct. 19, 2004   (JP) ............................. 2004-303729

(51) Int. Cl.
     *B23K 1/06*    (2006.01)
(52) U.S. Cl. .................. 228/110.1; 228/1.1; 156/580.1
(58) Field of Classification Search ................ 228/1.1, 228/110.1, 180.5, 4.1, 4.5, 6.2; 156/580.1, 156/580.2; 438/120
See application file for complete search history.

(56) References Cited

U.S. PATENT DOCUMENTS

| | | | | |
|---|---|---|---|---|
| 5,431,324 A | * | 7/1995 | Kajiwara et al. | 228/102 |
| 5,667,130 A | * | 9/1997 | Morita et al. | 228/110.1 |
| 5,931,367 A | * | 8/1999 | Sato et al. | 228/1.1 |
| 6,058,823 A | * | 5/2000 | Michoud | 83/508.3 |
| 6,109,502 A | * | 8/2000 | Sato | 228/1.1 |
| 6,247,628 B1 | * | 6/2001 | Sato et al. | 228/1.1 |
| 6,602,733 B1 | * | 8/2003 | Iwahashi et al. | 438/108 |
| 6,811,630 B1 | * | 11/2004 | Tominaga et al. | 156/73.1 |
| 6,824,630 B1 | * | 11/2004 | Oishi et al. | 156/73.1 |

FOREIGN PATENT DOCUMENTS

| | | | |
|---|---|---|---|
| JP | 10-284545 | * | 10/1998 |
| JP | 2002-67162 | | 3/2002 |

\* cited by examiner

*Primary Examiner*—Jonathan Johnson
*Assistant Examiner*—Michael Aboagye
(74) *Attorney, Agent, or Firm*—Armstrong, Kratz, Quintos, Hanson & Brooks, LLP

(57) ABSTRACT

A method of bonding and a bonding apparatus for a semiconductor chip uses ultrasonic vibration but can improve the bonds between electrode terminals of a semiconductor chip and a substrate. In a method of bonding a semiconductor chip that places electrode terminals of the semiconductor chip and electrode terminals of a substrate in contact and applies ultrasonic vibration to the semiconductor chip to bond the electrode terminals of the semiconductor chip and the substrate together, the ultrasonic vibration is compressional waves that are transmitted to the semiconductor chip and is set so that a half-wavelength of the ultrasonic vibration is a length given by multiplying a gap between adjacent electrode terminals in a direction of the compressional waves by a reciprocal of a natural number, and maximum amplitude points are located at positions of the respective electrode terminals of the semiconductor chip and the substrate.

5 Claims, 4 Drawing Sheets

FIG.1
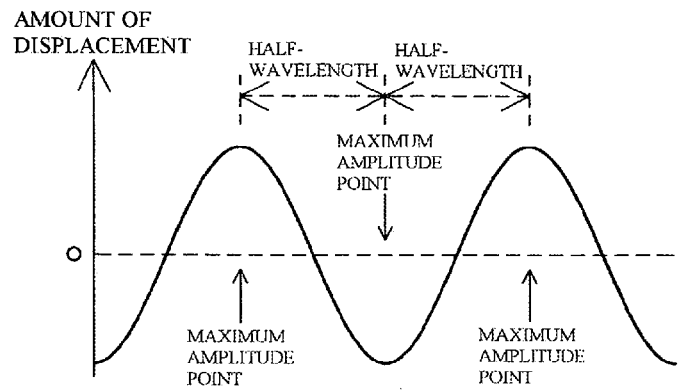
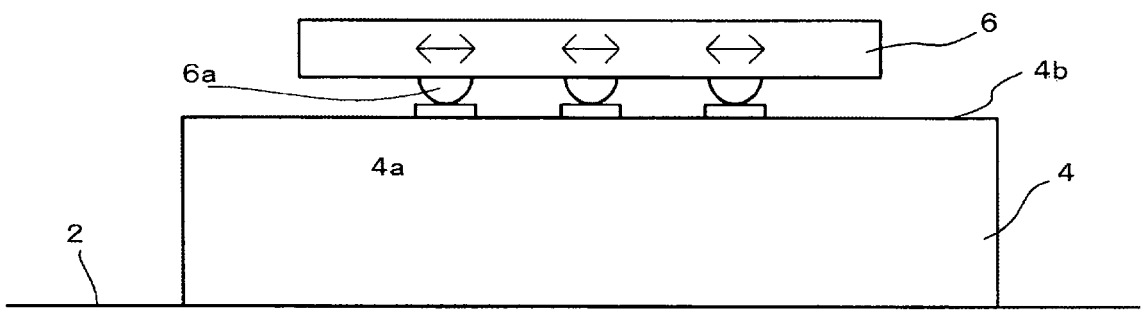
FIG.2
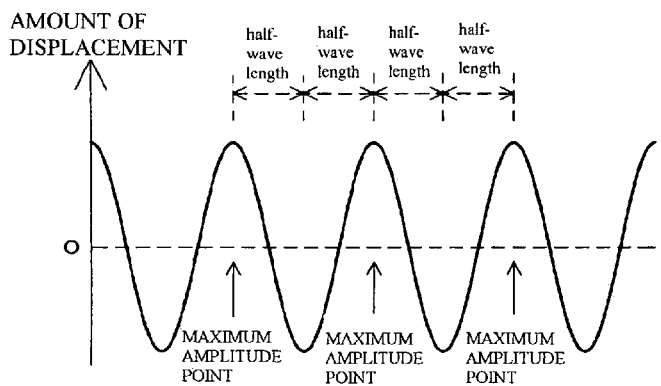
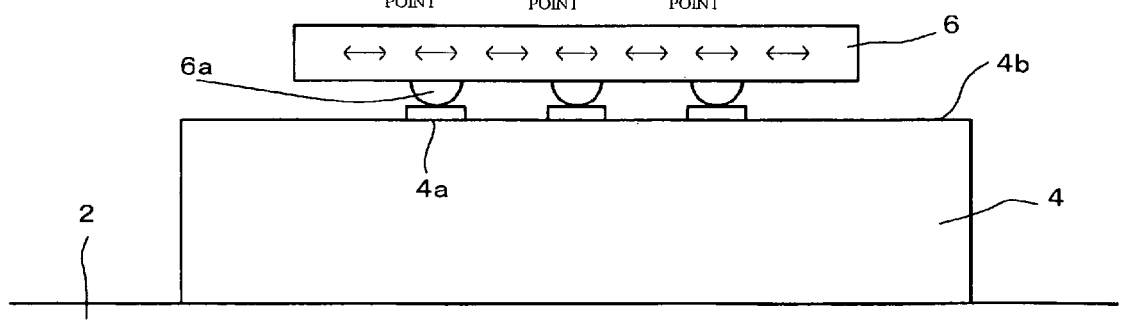

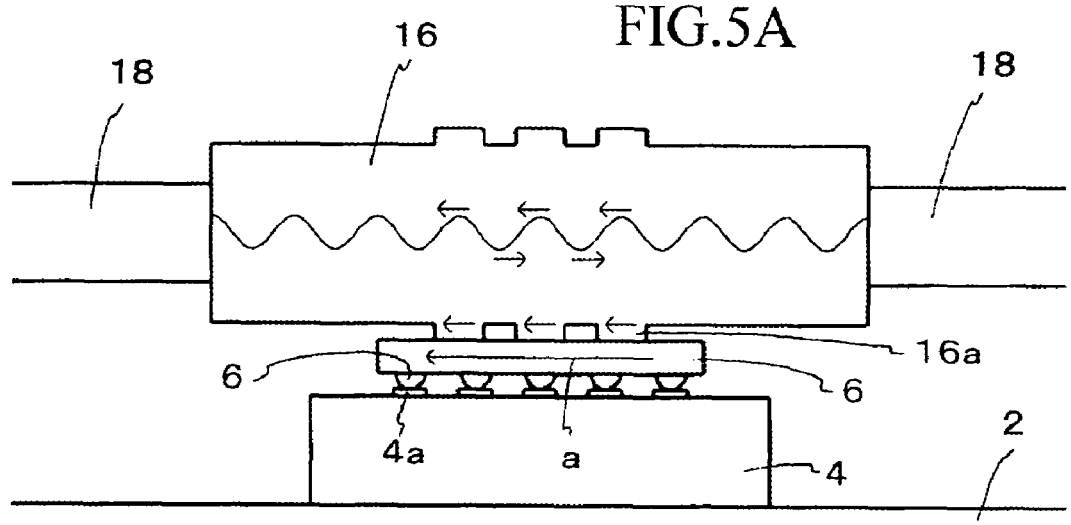
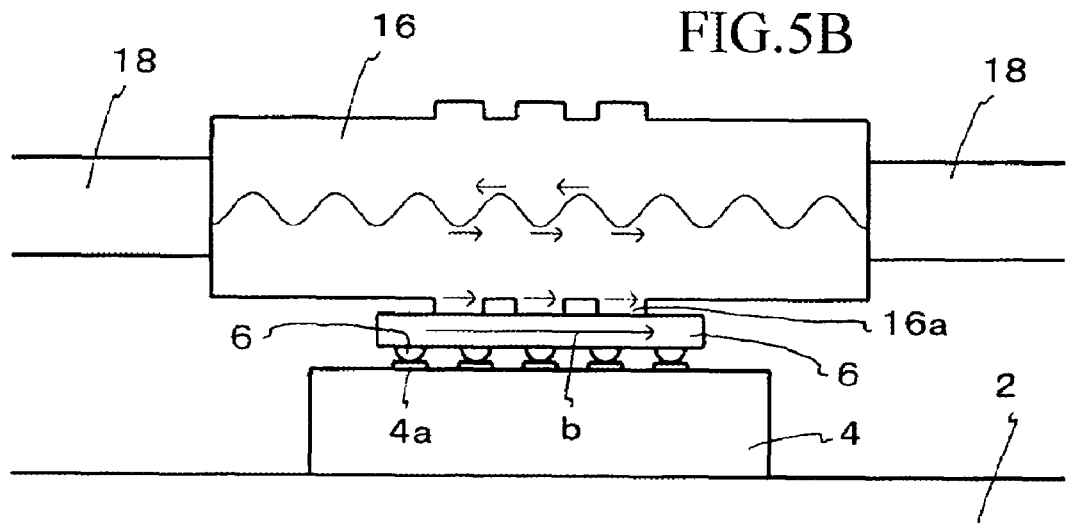

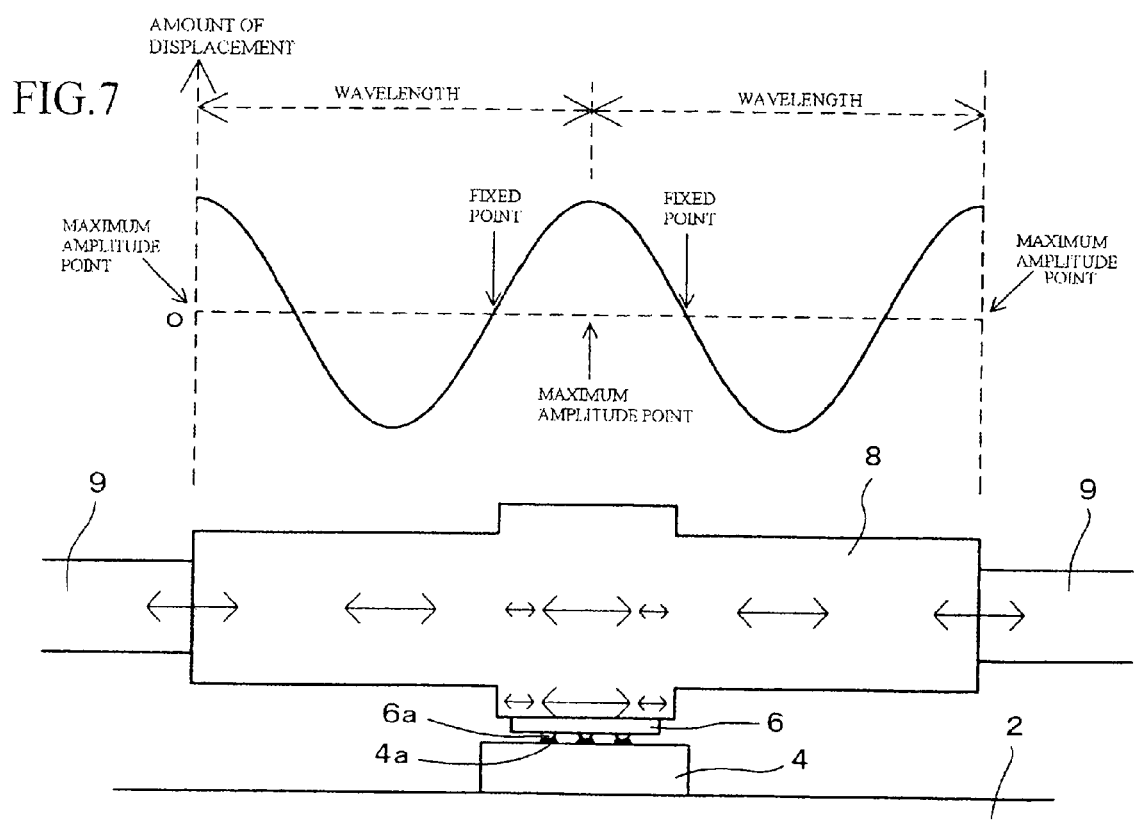
PRIOR ART

METHOD OF BONDING AND BONDING APPARATUS FOR A SEMICONDUCTOR CHIP

BACKGROUND OF THE INVENTION

1. Field of the Invention

The present invention is a method of bonding and a bonding apparatus for a semiconductor chip that places electrode terminals of a semiconductor chip and electrode terminals of a substrate in contact with each other and applies ultrasonic vibration to the semiconductor chip to bond the electrode terminals of the semiconductor chip and the substrate together.

2. Description of the Related Art

In recent years, when flip-chip bonding a semiconductor chip to a circuit board during the manufacturing of a semiconductor device such as a semiconductor package, a method is used where electrode terminals such as bumps of the semiconductor chip are placed in contact with electrode terminals such as pads of the circuit board and ultrasonic vibration is applied to the semiconductor chip to bond the electrode terminals of the semiconductor chip and the printed circuit board together.

A conventional method of flip-chip bonding that uses ultrasonic vibration is disclosed in Patent Document 1.

In the method of flip-chip bonding disclosed in Patent Document 1, bumps of a flip chip (semiconductor chip) that is held on a mount head by suction are placed in contact with connection terminals of a substrate, a load is applied, and an ultrasonic vibrator incorporated in the mount head is caused to ultrasonically vibrate so that the flip chip is ultrasonically vibrated via the mount head (see Paragraphs 0016 to 0018 and FIGS. 1 and 2 of Patent Document 1)

By doing so, an oxide layer or the like on the connected parts can be removed easily, and highly reliable electrical connections can be produced (see Paragraph 0022 of Patent Document 1).

Conventional examples of a method of bonding and a bonding apparatus for a semiconductor chip that use ultrasonic vibration will now be described with reference to FIG. 6.

In FIG. 6, a circuit board 4 is held on a stage 2. A semiconductor chip 6 is held on a bonding tool 8 (mount head) and is moved together with the bonding tool 8 to carry out positioning so that bumps 6a, 6a, . . . provided on the semiconductor chip 6 are respectively placed in contact with corresponding pads 4a, 4a, . . . provided on the circuit board 4. Both end surfaces of the bonding tool 8 are connected to an ultrasonic vibrator 9, and by ultrasonically vibrating the ultrasonic vibrator 9 in a horizontal direction using a vibration control apparatus (not shown), the bonding tool 8 and the semiconductor chip 6 are both ultrasonically vibrated.

By doing so, ultrasonic vibration is transmitted to the bonding tool 8 as compressional waves. These compressional waves inevitably have maximum amplitude points (points where the amount of displacement in the compressional wave direction is greatest) at both ends of the contact body 8 that are connected to the ultrasonic vibrator 9. To effectively apply physical vibrations to the semiconductor chip 6, the semiconductor chip 6 is disposed in the vicinity of a maximum amplitude point of the compressional waves. In the example shown in FIG. 6, the semiconductor chip 6 is disposed in the vicinity of a maximum amplitude point of the compressional waves by setting the wavelength of the compressional waves equal to the length of the bonding tool 8 in the compressional wave direction and holding the semiconductor chip 6 at a position in a central part of the bonding tool 8.

Patent Document 1

Japanese Laid-Open Patent Publication No. H10–12669 (See Paragraphs 0016–0018 and 0022, and FIGS. 1 and 2).

However, in the conventional method of bonding a semiconductor chip that uses ultrasonic vibration, there is the problem that when the bonding characteristics of the electrode terminals (such as bumps and pads) of a semiconductor chip and a substrate are not sufficient, defects are caused in a semiconductor device.

SUMMARY OF THE INVENTION

The present invention was conceived to solve the problem described above and it is an object of the present invention to provide a method of bonding and bonding apparatus for a semiconductor chip that use ultrasonic vibration but can improve the bonding characteristics for the electrode terminals of a semiconductor chip and a substrate.

To solve the above problem, the inventors focused on the frequency of the ultrasonic vibration and realized that if ultrasonic vibration of a higher frequency is applied to a semiconductor chip, during bonding it is possible to prevent oxidization of the electrode terminals in between the vibration cycles and also possible to raise the energy applied to the electrode terminals per unit time, so that the bonding characteristics of the electrode terminals can be improved.

That is, although the conventional method of bonding a semiconductor chip normally uses an ultrasonic vibration frequency of around 50 kHz, it is believed that if it were possible to use ultrasonic vibration of a much higher frequency, it would be possible to improve the bonding characteristics when bonding electrode terminals together.

By changing the settings or the like of a vibration control apparatus of an ultrasonic vibrator, it is possible to increase the frequency of the ultrasonic vibration (compressional waves). As one example, FIG. 7 is a diagram useful in explaining the case where frequency of the compressional waves is doubled compared to the conventional example shown in FIG. 6. Here, the relationship between the wavelength $\lambda$ and the frequency f of the compressional waves transmitted to a bonding tool 8 is such that $\lambda = V/f$ where V is the velocity of the compressional waves. The velocity of the compressional waves (sonic velocity) is a constant that is unique to the material of the bonding tool 8, so that if the frequency f is doubled, the wavelength $\lambda$ is halved.

This means that the distance between the fixed points of the compressional waves is narrowed, which produces positions where the amplitude is large and positions where the amplitude is extremely small (near ends of the semiconductor chip 6 in FIG. 7) on the semiconductor chip 6, with the bonding characteristics of the bonding terminals worsening at the positions where the amplitude is small.

If the frequency of the ultrasonic vibration (compressional waves) is further increased, the fixed points will become positioned over the semiconductor chip 6, resulting in electrode terminals where the amplitude of the ultrasonic vibration has no action whatsoever.

In this way, it is not possible to increase the bonding characteristics of all of the electrode terminals by merely raising the frequency.

To avoid the above problem, it may seem possible to change the material of the bonding tool 8 and the like to increase the velocity of the compressional waves and in turn the wavelength λ or to reduce the length of the semiconductor chip 6 in the compressional wave direction, but large changes would be necessary to the constructions of the bonding tool 8 and the semiconductor chip 6 and in either case there is a low limit on the possible increase in frequency.

By carefully investigating a method of bonding and bonding apparatus of a semiconductor chip that can use ultrasonic vibration of a much higher frequency than conventional methods, the inventor arrived at the present invention.

To achieve the object described above, a method of bonding a semiconductor chip according to the present invention places electrode terminals of the semiconductor chip and electrode terminals of a substrate in contact and applies ultrasonic vibration to the semiconductor chip to bond the electrode terminals of the semiconductor chip and the substrate together, wherein the ultrasonic vibration is compressional waves that are transmitted to the semiconductor chip and is set so that a half-wavelength of the ultrasonic vibration is a length given by multiplying a gap between adjacent electrode terminals in a direction of the compressional waves by a reciprocal of a natural number, and maximum amplitude points are located at positions of the respective electrode terminals of the semiconductor chip and the substrate.

In addition, the ultrasonic vibration may be applied to the semiconductor chip by placing an ultrasonic vibrator in contact with side surfaces of the semiconductor chip directly or via a contact body and causing the ultrasonic vibrator to ultrasonically vibrate.

By doing so, it is possible to apply ultrasonic vibration directly to the semiconductor chip from the side surfaces, so that it is possible to effectively apply ultrasonic vibration to the respective electrode terminals.

The ultrasonic vibration may be applied to the semiconductor chip by placing a contact body in contact with an opposite surface of the semiconductor chip to a surface on which the electrode terminals are formed and causing the ultrasonic vibrator to vibrate.

Maximum amplitude points may be positioned at the side ends of the semiconductor chip, so that the semiconductor chip needs to be constructed so that the distance between the side ends and the electrode terminals that are closest to the side ends is a natural number multiple of a half-wavelength of the ultrasonic vibration. The maximum amplitude points can be set at the respective electrode terminals irrespective of the distance between the side ends of the semiconductor chip and the electrode terminals.

In addition, protruding parts may be formed on the contact body at positions corresponding to the respective electrode terminals of the semiconductor chip and the substrate, and the contact body may be caused to ultrasonically vibrate with end surfaces of the protruding parts having been placed in contact with the opposite surface of the semiconductor chip.

By doing so, it is possible to effectively apply the ultrasonic vibration to the respective electrode terminals via the protruding parts.

Another method of bonding a semiconductor chip according to the present invention places electrode terminals of the semiconductor chip and electrode terminals of a substrate in contact and bonds the electrode terminals of the semiconductor chip and the substrate together by causing a contact body placed in contact with an opposite surface of the semiconductor chip to a surface on which the electrode terminals are formed to ultrasonically vibrate and apply ultrasonic vibration to the semiconductor chip, wherein a plurality of protruding parts are formed on the contact body, end surfaces of the protruding parts of the contact body are placed in contact with the opposite surface of the semiconductor chip, and the ultrasonic vibration is compressional waves that are transmitted to the contact body and is set so that a wavelength of the ultrasonic vibration is a length given by multiplying a gap between adjacent protruding parts in a direction of the compressional waves by a reciprocal of a natural number, and maximum amplitude points of the ultrasonic vibration are located at positions of the respective protruding parts.

A bonding apparatus for a semiconductor chip according to the present invention places electrode terminals of the semiconductor chip and electrode terminals of a substrate in contact and applies ultrasonic vibration to the semiconductor chip to bond the electrode terminals of the semiconductor chip and the substrate together, the bonding apparatus including: a contact body that is placed in contact with the semiconductor chip; and an ultrasonic vibrator that applies the ultrasonic vibration to the semiconductor chip via the contact body, the ultrasonic vibration being compressional waves that are transmitted to the semiconductor chip and being set so that a half-wavelength of the ultrasonic vibration is a length given by multiplying a gap between adjacent electrode terminals in a direction of the compressional waves by a reciprocal of a natural number and maximum amplitude points are located at positions of the respective electrode terminals of the semiconductor chip and the substrate.

In addition, the ultrasonic vibrator may be placed in contact with side surfaces of the semiconductor chip directly or via a contact body and apply the ultrasonic vibration to the semiconductor chip.

By doing so, it is possible to apply ultrasonic vibration directly to the semiconductor chip from the side surfaces, so that it is possible to effectively apply ultrasonic vibration to the respective electrode terminals.

The ultrasonic vibrator may be placed in contact with the contact body that is in contact with an opposite surface of the semiconductor chip to a surface on which the electrode terminals are formed and apply the ultrasonic vibration to the semiconductor chip via the contact body.

Maximum amplitude points may be positioned at the side ends of the semiconductor chip, so that the semiconductor chip needs to be constructed so that the distance between the side ends and the electrode terminals that are closest to the side ends is a natural number multiple of the half-wavelength of the ultrasonic vibration. The maximum amplitude points can be set at the respective electrode terminals irrespective of the distance between the side ends of the semiconductor chip and the electrode terminals.

In addition, protruding parts whose end surfaces contact the opposite surface of the semiconductor chip are formed on the contact body at positions corresponding to the respective electrode terminals of the semiconductor chip and the substrate.

By doing so, it is possible to effectively apply the ultrasonic vibration to the respective electrode terminals via the protruding parts.

Another bonding apparatus for a semiconductor chip according to the present invention places electrode terminals of the semiconductor chip and electrode terminals of a substrate in contact with each other and applies ultrasonic vibration to the semiconductor chip to bond the electrode terminals of the semiconductor chip and the substrate, the bonding apparatus including: a contact body that has a plurality of protruding parts whose front ends are placed in contact with an opposite surface of the semiconductor chip to a surface on which the electrode terminals are formed; and an ultrasonic vibrator that applies the ultrasonic vibration to the semiconductor chip via the contact body, the ultrasonic vibration being compressional waves transmitted to the contact body and set so that a wavelength of the ultrasonic vibration is a length given by multiplying a gap between adjacent protruding parts in a direction of the compressional waves by a reciprocal of a natural number and maximum amplitude points of the ultrasonic vibration are located at positions of the respective protruding parts.

The half-wavelength of the compressional waves of the ultrasonic vibration may be set at a length given by multiplying a gap between adjacent electrode terminals by a reciprocal of a natural number, and maximum amplitude points of the compressional waves are located at positions of the respective electrode terminals, so that it is possible to bond the electrode terminals using extremely high frequency ultrasonic vibration and the bonding strength of bonds between the electrode terminals can be increased.

The half-wavelength of the compressional waves of the ultrasonic vibration may be set at a length given by multiplying a gap between adjacent electrode terminals by a reciprocal of a natural number, and maximum amplitude points of the compressional waves are located at positions of the respective electrode terminals, so that it is possible to bond the electrode terminals using extremely high frequency ultrasonic vibration and the bonding strength of bonds between the electrode terminals can be increased.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings:

FIG. 1 is a diagram useful in explaining the principles of the method of bonding a semiconductor chip according to the present invention;

FIG. 2 is a diagram useful in explaining the principles of the method of bonding a semiconductor chip according to the present invention;

FIGS. 5A and 5B are diagrams showing a third embodiment of the present invention;

FIG. 7 is a diagram useful in explaining the principles of a conventional method of bonding a semiconductor chip.

DESCRIPTION OF THE PREFERRED EMBODIMENTS

Figure 3:
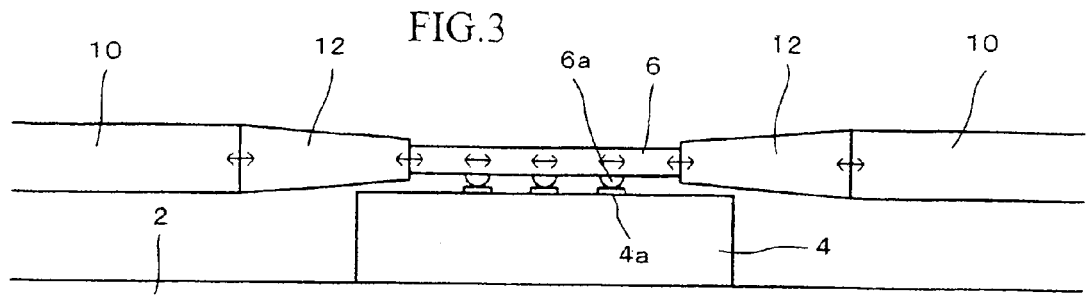
FIG. 3 is a diagram showing a first embodiment of the present invention.

Preferred embodiments of a method of bonding and a bonding apparatus for a semiconductor chip according to the present invention will now be described in detail with reference to the attached drawings.

FIGS. 1 and 2 are diagrams useful in explaining the principles of the method of bonding a semiconductor chip the resent invention.

In FIGS. 1 and 2, a circuit board 4 (substrate) is held on the stage 2. The circuit board 4 has pads 4a, 4a, . . . (electrode terminals) corresponding to the bumps 6a, 6a, . . . (electrode terminals) of the semiconductor chip 6 on a mounting surface 4b on which the semiconductor chip 6 is mounted.

The semiconductor chip 6 is positioned so that the bumps 6a, 6a, . . . provided as electrode terminals are placed in contact with the respective pads 4a, 4a, . . . of the circuit board 4.

In this state, ultrasonic vibration for compressional waves that propagate in a direction in which the bumps 6a are aligned is applied to the semiconductor chip 6 to bond the bumps 6a of the semiconductor chip 6 and the pads 4a of the circuit board 4.

In FIGS. 1 and 2, the amplitude (amount of displacement in the direction of the compressional waves) of the ultrasonic vibration (compressional waves) is shown in the graphs positioned above the semiconductor chip 6.

In FIG. 1, the compressional waves (ultrasonic vibration) to be applied are set so that a half-wavelength of the compressional waves is equal to the gaps between the respective electrode terminals (the bumps 6a and the pads 4a) that are adjacent in the compressional wave direction (the left-right direction in FIG. 1) (that is, so that the half-wavelength is equal to (1×) the gaps between the electrode terminals). In addition, the maximum amplitude points (points where the amount of displacement in the compressional wave direction is greatest) of the compressional waves are set so as to be located at the positions of the respective electrode terminals.

By doing so, compared to a conventional method of bonding a semiconductor chip where it is necessary to make the length of the half-wavelength of the compressional waves longer than the length of the semiconductor chip 6 in the compressional wave direction, even if the frequency of the compressional waves is raised considerably, the electrode terminals will not be positioned at fixed points or low amplitude points for the compressional waves, so that ultrasonic vibration can be sufficiently and reliably applied to the respective electrode terminals.

In FIG. 2, the half-wavelength of the applied compressional waves (ultrasonic vibration) is set at half the length of the gaps between adjacent electrode terminals (the bumps 6a and the pads 4a). By doing so, compared to the case shown in FIG. 1, ultrasonic vibration of double the frequency can be applied to the respective electrode terminals.

Normally, if the half-wavelength of the ultrasonic vibration is set at "a length given by multiplying the gap between respective electrode terminals by a reciprocal of a natural number", it is possible to locate the maximum amplitude points of the ultrasonic bonding at the respective positions of the electrode terminals.

It should be noted that as the combinations of materials for the bumps of the semiconductor chip and the pads of the circuit board, it is normal to use gold (Au) for both the bumps and the pads or to use to gold for the bumps and aluminum (Al) for the pads. However, the present invention is not limited to such combinations.

First Embodiment

Specific examples of a method and an apparatus that apply ultrasonic vibration set as described above to the semiconductor chip 6 are shown in FIG. 3.

As shown in FIG. 3, the ends of an ultrasonic vibrator 10 are attached to horns 12 as a contact body and end parts of the horn 12 are placed in contact with side surfaces of the semiconductor chip 6. By having the ultrasonic vibrator 10 ultrasonically vibrate using a vibration control apparatus (not shown), ultrasonic bonding can be applied to the semiconductor chip 6 via the horn 12.

The horn 12 is formed so as to be tapered from the ultrasonic vibrator 10 side toward the tip, so that the ultrasonic vibration can be amplified toward the tip of the horn 12 and ultrasonic vibration with a large amplitude can be effectively transmitted to the semiconductor chip 6.

It should be noted that the contact body does not need to be a horn. Also, the ultrasonic vibrator 10 may be placed in direct contact with the semiconductor chip 6 without a contact body in between.

In addition, a pressing means that presses the semiconductor chip 6 from above toward the circuit board 4 may be provided separately and by applying ultrasonic vibration while pressing the semiconductor chip 6 onto the circuit board 4, it is possible to bond the electrode terminals more strongly.

Second Embodiment

Next, other examples of the method and apparatus for applying ultrasonic vibration to the semiconductor chip 6 will be described with reference to FIG. 4.

Figure 4:
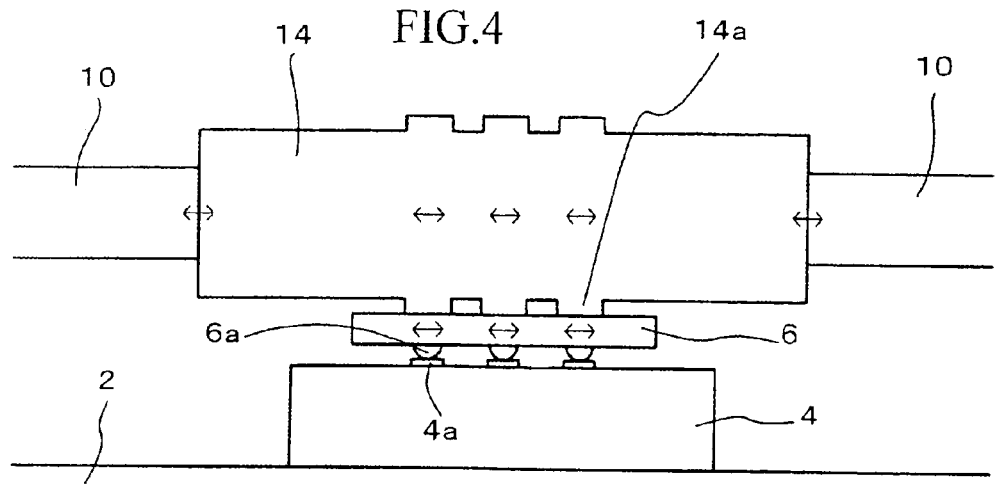
FIG. 4 is a diagram showing a second embodiment of the present invention.
Figure 6:
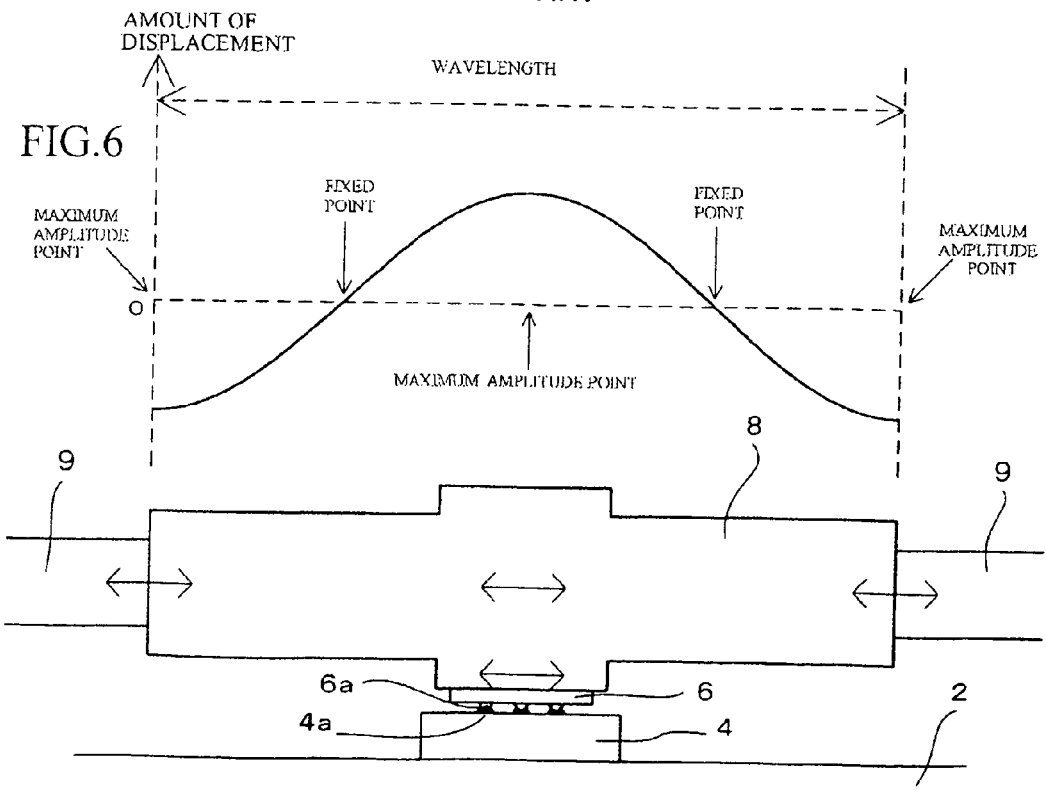
FIG. 6 is a diagram useful in explaining the principles of a conventional method of bonding a semiconductor chip.

In FIG. 4, the circuit board 4 is held on a stage 2. The semiconductor chip 6 is held on a bonding tool 14 (mount head) as a contact body and is moved together with the bonding tool 14, and is positioned so that the bumps 6a, 6a, . . . provided on the semiconductor chip 6 are respectively placed in contact with the corresponding pads 4a, 4a, . . . provided on the circuit board 4.

Both end surfaces of the bonding tool 14 are connected to the ultrasonic vibrator 10, and by having the ultrasonic vibrator 10 ultrasonically vibrate in a horizontal direction using a vibration control apparatus (not shown), the bonding tool 14 and the semiconductor chip 6 are ultrasonically vibrated together.

On the bonding tool 14, protruding parts 14a are formed at positions corresponding to the respective electrode terminals (the bumps 6a and the pads 4a) of the semiconductor chip 6 and the circuit board 4, and end surfaces of the protruding parts 14a are placed in contact with an opposite surface of the semiconductor chip 6 to the surface on which the bumps 6a are formed. The bonding tool 14 applies a load to the semiconductor chip 6 in the downward direction in FIG. 4.

By doing so, ultrasonic vibration can be effectively applied to the electrode terminals via the protruding parts 14a.

Third Embodiment

While the first and second embodiments are constructions that apply compressional waves to the semiconductor chip 6, a third embodiment relates to a construction that vibrates the entire semiconductor chip 6 at high frequency.

FIGS. 5A and 5B are diagrams useful in explaining the construction of the third embodiment.

It should be noted that since the bonding apparatus for a semiconductor chip according to the third embodiment has the same fundamental construction as the second embodiment, description is omitted for parts of the construction that are common to the second embodiment and only different parts of the construction are described.

Protruding parts 16a that contact the semiconductor chip 6 are provided on the bonding tool 16 at fixed gaps. However, unlike the protruding parts 14a of the second embodiment, the formation positions of the protruding parts 16a do not need to be located at positions corresponding to the respective electrode terminals (the bumps 6a and the pads 4a) of the semiconductor chip 6 and the circuit board 4.

An ultrasonic vibrator 18 that applies ultrasonic vibration to the semiconductor chip 6 via the bonding tool 16 applies the ultrasonic vibration so that compressional waves transmitted to the bonding tool 16 have a wavelength that is given by multiplying the gaps between respective adjacent protruding parts 16a in the compressional wave direction by a reciprocal of a natural number (in FIGS. 5A and 5B, the wavelength is equal to the gaps) and so that maximum amplitude points are located at the positions of the respective protruding parts.

According to the bonding apparatus and method of bonding for a semiconductor chip according to the third embodiment, as shown in FIGS. 5A and 5B, the bonding terminals 16a are provided at gaps of the wavelength of the ultrasonic vibration and are positioned at the maximum amplitude points. Accordingly, the respective protruding parts 16a are vibrated by the same displacement in the same direction by the compressional waves transmitted to the bonding tool 16. In addition, at positions between the respective protruding parts 16a that are displaced in the opposite direction to the protruding parts 16a by the ultrasonic vibration, the bonding tool 16 and the semiconductor chip 6 are not in contact, so that the semiconductor chip 6 is displaced in accordance with the respective protruding parts 16a and the entire semiconductor chip 6 vibrates in the horizontal direction. That is, the entire semiconductor chip 6 repeatedly vibrates between a displacement in the left direction a shown in FIG. 5A and a displacement in the right direction b shown in FIG. 5B.

As described above, according to the first and second embodiments, the maximum amplitude points of the ultrasonic vibration transmitted to the semiconductor chip 6 are located at the positions of the electrode terminals (the bumps 6a and the pads 4a), so that it is possible to sufficiently vibrate the respective electrode terminals while using high-frequency ultrasonic vibration.

Also, according to the third embodiment the entire semiconductor chip 6 can be vibrated at high frequency.

The present inventor conducted experiments using the method of bonding a semiconductor chip according to the present invention with the frequency of the applied ultrasonic vibration set at a higher frequency than a conventional frequency of around 50 kHz, and confirmed that bonding strength is increased compared to when the conventional frequency is used.

Control experiments were carried out by increasing the period for which the 50 kHz ultrasonic vibration is continuously applied to make the number of vibrations equal to the number of vibrations applied by the ultrasound of the high frequency described above, but it was found in this case that bonding strength was higher when bonding with the high-frequency ultrasonic vibration.

It is believed that the increase in bonding strength is due to the vibration cycles being shorter when the high frequency ultrasonic vibration is used as described above, so that during bonding it is possible to prevent the electrode terminals oxidizing in between the vibration cycles and the energy applied to the electrode terminals per unit time can be increased.

Although the present embodiment has been described for the case where a semiconductor chip is bonded to a circuit board, the method of bonding a semiconductor chip according to the present invention is not limited to this, and can be applied to all kinds of fields where electrode terminals of a semiconductor chip are bonded using ultrasonic vibration.

For example, in recent years research has been conducted into technology that bonds semiconductor chips together via electrode terminals, and in this case also, it is possible to apply the present invention that sets the ultrasonic vibration so that the maximum amplitude points of the ultrasonic vibration are located at the positions of the electrode terminals or has the entire semiconductor chip ultrasonically vibrate at a high frequency.

In addition, in cases where external connection terminals (electrode terminals) of the semiconductor device are bonded to a printed circuit board using ultrasonic vibration, it is possible to apply the present invention that sets the ultrasonic vibration so that the maximum amplitude points of the ultrasonic vibration are located at the positions of the external connection terminals or has the entire semiconductor chip ultrasonically vibrate at a high frequency.

What is claimed is:

1. A method of bonding a semiconductor chip comprising the steps of:
    placing electrode terminals of the semiconductor chip and electrode terminals of a substrate in contact with each other; and
    applying ultrasonic vibration to the semiconductor chip to bond the electrode terminals of the semiconductor chip and the substrate together,
    wherein the ultrasonic vibration comprises compressional waves that are transmitted to the semiconductor chip and is set so that a half-wavelength of the ultrasonic vibration is a length given by multiplying a gap between adjacent electrode terminals in a direction of the compressional waves by a reciprocal of a natural number, and maximum amplitude points are located at positions of the respective electrode terminals of the semiconductor chip and the substrate.

2. A method of bonding a semiconductor chip according to claim 1, wherein the ultrasonic vibration is applied to the semiconductor chip by placing an ultrasonic vibrator in contact with side surfaces of the semiconductor chip directly or via a contact body and causing the ultrasonic vibrator to ultrasonically vibrate.

3. A method of bonding a semiconductor chip according to claim 1, wherein the ultrasonic vibration is applied to the semiconductor chip by placing a contact body in contact with an opposite surface of the semiconductor chip to a surface on which the electrode terminals are formed and causing the ultrasonic vibrator to vibrate.

4. A method of bonding a semiconductor chip according to claim 3, wherein protruding parts are formed on the contact body at positions corresponding to the respective electrode terminals of the semiconductor chip and the substrate, and the contact body is caused to ultrasonically vibrate with end surfaces of the protruding parts having been placed in contact with the opposite surface of the semiconductor chip.

5. A method of bonding a semiconductor chip comprising the steps of:
    placing electrode terminals of the semiconductor chip and electrode terminals of a substrate in contact with each other; and
    bonding the electrode terminals of the semiconductor chip and the substrate together by causing a contact body placed in contact with an opposite surface of the semiconductor chip to a surface on which the electrode terminals are formed to ultrasonically vibrate and apply ultrasonic vibration to the semiconductor chip,
    wherein a plurality of protruding parts are formed on the contact body,
    end surfaces of the protruding parts of the contact body are placed in contact with the opposite surface of the semiconductor chip, and
    the ultrasonic vibration comprises compressional waves that are transmitted to the contact body and is set so that a wavelength of the ultrasonic vibration is a length given by multiplying a gap between adjacent protruding parts in a direction of the compressional waves by a reciprocal of a natural number, and maximum amplitude points of the ultrasonic vibration are located at positions of the respective protruding parts.

* * * * *